(12) United States Patent
Alden, III et al.

(10) Patent No.: US 8,562,359 B2
(45) Date of Patent: Oct. 22, 2013

(54) ELECTRICAL CONTACT FOR INTERCONNECT MEMBER

(75) Inventors: Wayne Stewart Alden, III, Whitman, MA (US); Jeffery Walter Mason, North Attleboro, MA (US); William Brian Murphy, Brockton, MA (US)

(73) Assignee: Tyco Electronics Corporation, Berwyn, PA (US)

( * ) Notice: Subject to any disclaimer, the term of this patent is extended or adjusted under 35 U.S.C. 154(b) by 212 days.

(21) Appl. No.: 13/008,643

(22) Filed: Jan. 18, 2011

(65) Prior Publication Data

US 2012/0184157 A1    Jul. 19, 2012

(51) Int. Cl.
*H01R 12/00*    (2006.01)

(52) U.S. Cl.
USPC ............................................................ 439/66

(58) Field of Classification Search
USPC ............................................. 439/66, 700, 824
See application file for complete search history.

(56) References Cited

U.S. PATENT DOCUMENTS

| | | |
|---|---|---|
| 4,778,404 A | 10/1988 | Pass |
| 5,167,512 A | 12/1992 | Walkup |
| 5,982,187 A | 11/1999 | Tarzwell |
| 6,033,233 A * | 3/2000 | Haseyama et al. ............... 439/66 |
| 6,264,476 B1 * | 7/2001 | Li et al. ............................ 439/66 |
| 6,716,038 B2 | 4/2004 | Garcia |
| 7,014,473 B2 | 3/2006 | Millard et al. |
| 7,029,288 B2 | 4/2006 | Li |
| 8,029,291 B2 * | 10/2011 | Park ................................ 439/66 |

* cited by examiner

*Primary Examiner* — Phuong Dinh

(57) ABSTRACT

An electrical contact is provided. The electrical contact includes an integrally-formed body having a mating segment, a mounting segment, and a pair of arms interconnect the mating segment and the mounting segment. The arms extend along helical paths for at least some distance as the arms extend from the mating segment to the mounting segment.

19 Claims, 10 Drawing Sheets

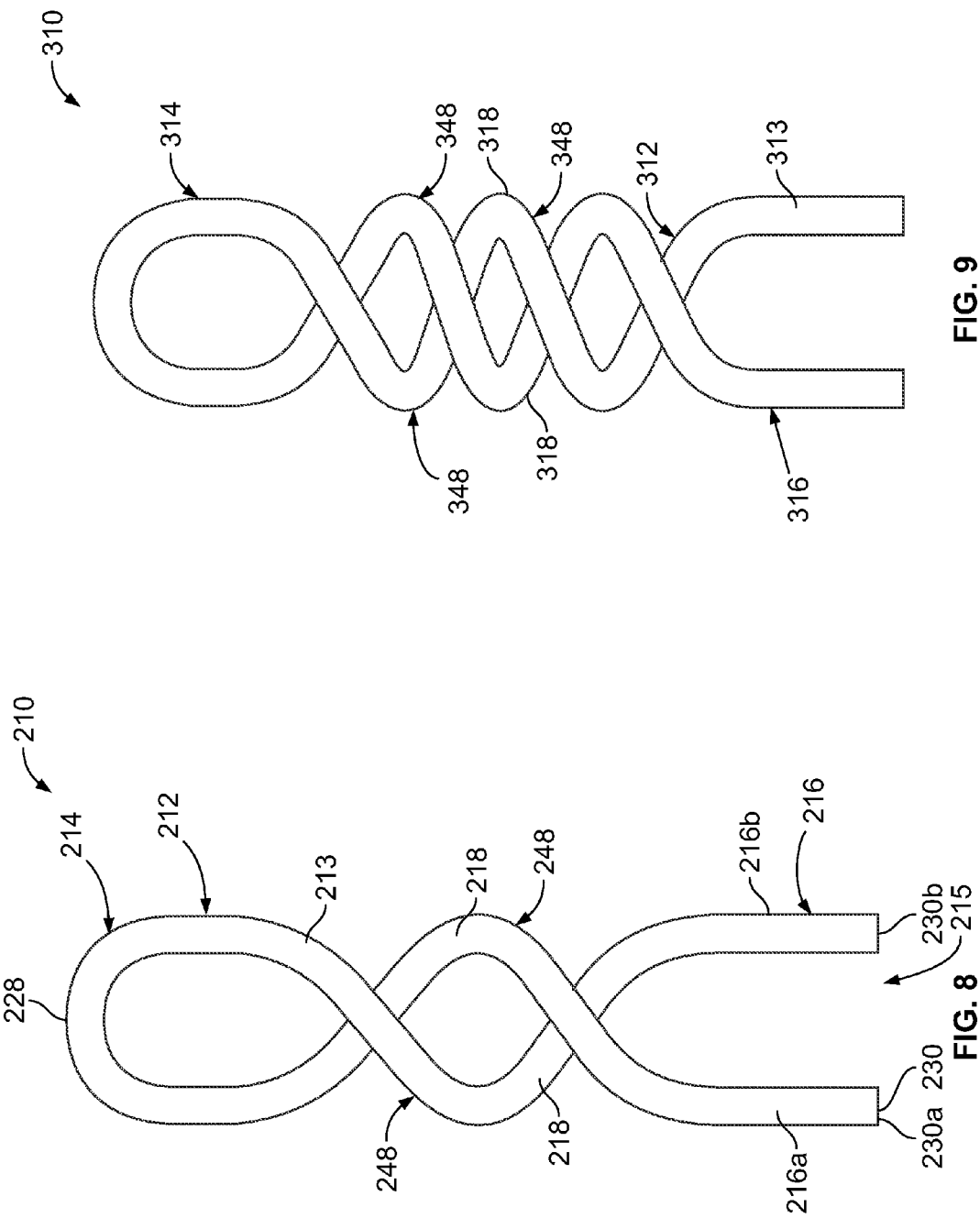

ELECTRICAL CONTACT FOR INTERCONNECT MEMBER

BACKGROUND OF THE INVENTION

The subject matter described and/or illustrated herein relates generally to electrical contacts, and more particularly, to the electrical contacts of interconnect members that electrically interconnect electrical components.

Interconnect members are sometimes used to provide electrical connection between different electrical components, such as, but not limited to, integrated circuits, electronic modules, printed circuit boards, and the like. Many of these electrical components have mating contacts arranged in a "land grid array" (LGA), which is a two-dimensional array of contact pads. One type of interconnect device, sometimes known as an "interposer", has an array of compressible contacts which is placed between the two opposing arrays of the electrical components to provide an electrical connection between the mating contacts of the opposing arrays.

Competition and market demands have continued the trend toward smaller and higher performance (e.g., faster) electronic systems. To achieve such smaller and higher performance systems, it may be desirable to increase the number and/or density of mating contacts on the electrical components. The compressible contacts of interconnect members are typically spring beams that include a bend to enable the beam to compress by folding about the bend. Other known compressible contacts of interconnect members have discrete springs that are separate from, and surround, a body of the contact. But, known compressible contacts of interconnect members suffer from disadvantages when used with an increased number and/or density of mating contacts on the electrical components. For example, known compressible contacts may have a limited working range. Additionally, the contact force required to compress known contacts may be higher than is desired, which may increase the stresses that build within the contact during compression thereof. The increased stresses may cause the contact to fatigue and thereby fail. Moreover, the increased stresses within the contact may limit the number of mating cycles of the contact and/or may limit the working range of the contact even further.

BRIEF DESCRIPTION OF THE INVENTION

In one embodiment, an electrical contact is provided. The electrical contact includes an integrally-formed body having a mating segment, a mounting segment, and a pair of arms interconnecting the mating segment and the mounting segment. The arms extend along helical paths for at least some distance as the arms extend from the mating segment to the mounting segment.

In another embodiment, an interconnect member is provided for electrically connecting a pair of electrical components. The interconnect member includes a carrier having opposite mating and mounting sides. The carrier includes an opening extending through the carrier, and an electrical contact disposed in the opening of the carrier. The electrical contact includes an integrally-formed body, which includes a mating segment, a mounting segment, and a pair of arms interconnecting the mating segment and the mounting segment. The electrical contact is arranged in the opening of the carrier such that the mating segment is exposed along the mating side of the carrier and such that the mounting segment is exposed along the mounting side of the carrier. The arms extend along helical paths for at least some distance as the arms extend from the mating segment to the mounting segment.

In another embodiment, an electrical contact includes an integrally-formed body having a mating segment, a mounting segment, and an arm interconnecting the mating segment and the mounting segment. The arm extends along a helical path for at least some distance as the arm extends from the mating segment to the mounting segment. The body includes a central opening extending within the helical path of the arm. An arbor is received within the central opening of the body such that the arbor extends between the mating and mounting segments of the body.

BRIEF DESCRIPTION OF THE DRAWINGS

FIG. 7 is an exploded cross-sectional view of an exemplary embodiment of an electrical component assembly that the electrical contacts shown and/or described herein may be used with.

FIG. 8 is a side elevational view of another exemplary alternative embodiment of an electrical contact.

FIG. 9 is a side elevational view of another exemplary alternative embodiment of an electrical contact.

DETAILED DESCRIPTION OF THE INVENTION

Figure 1:
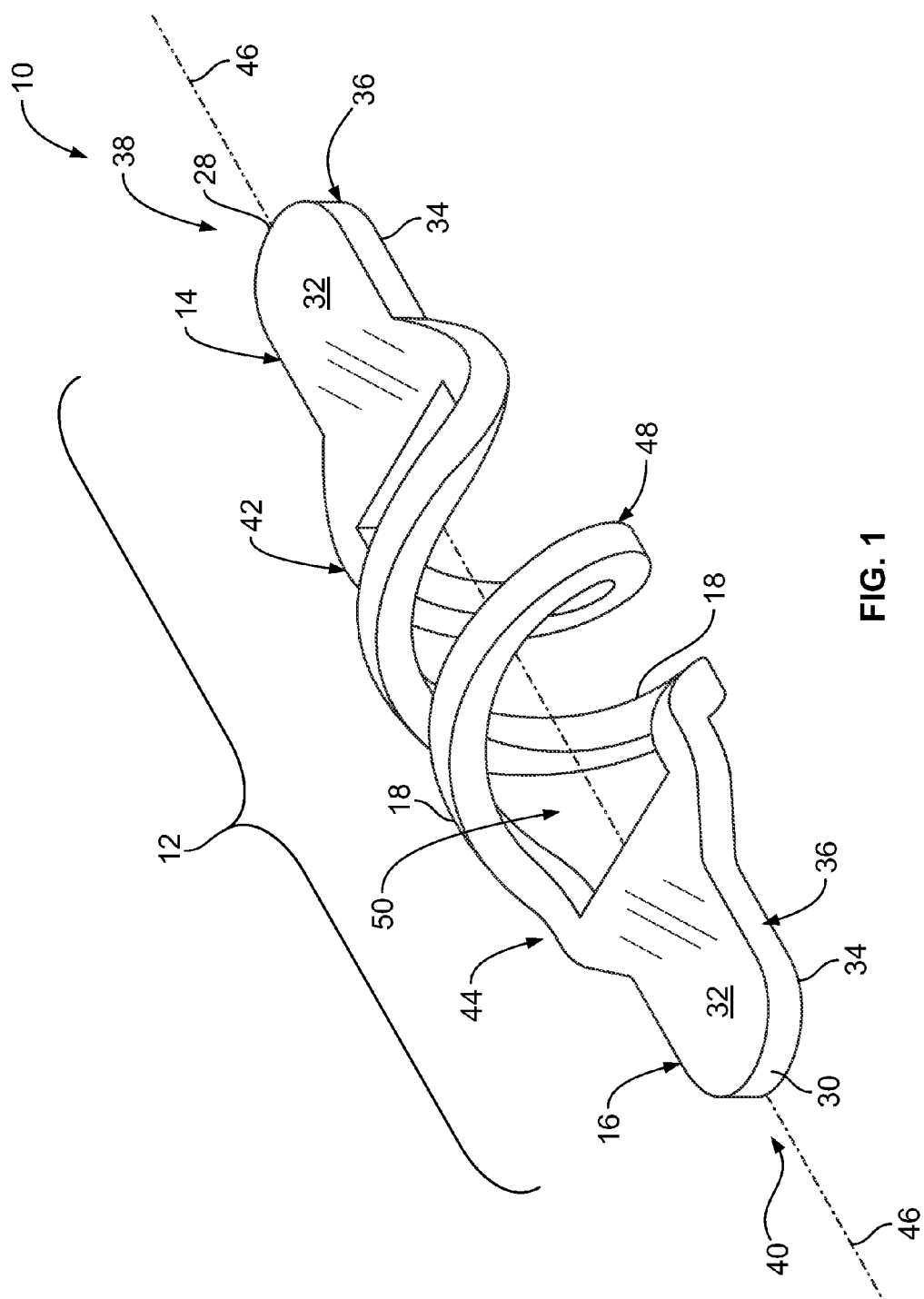
FIG. 1 is a perspective view of an exemplary embodiment of an electrical contact.
Figure 2:
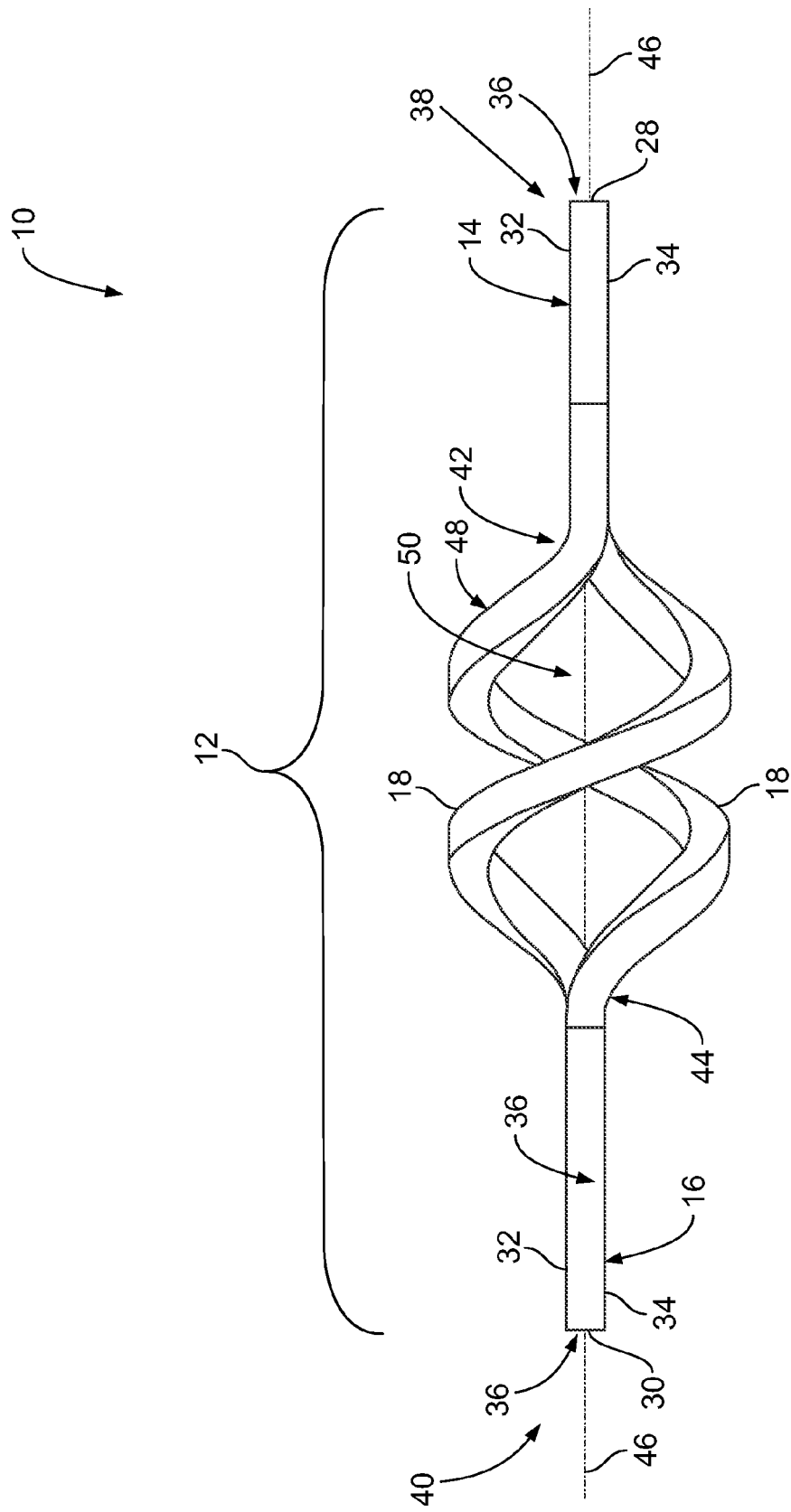
FIG. 2 is a side elevational view of the electrical contact shown in FIG. 1.

FIG. 1 is a perspective view of an exemplary embodiment of an electrical contact 10. FIG. 2 is a side elevational view of the electrical contact 10. Referring now to FIGS. 1 and 2, the electrical contact 10 includes a body 12, which includes a mating segment 14, a mating segment 16, and one or more arms 18. The arms 18 extend from the mating segment 14 to the mounting segment 16, and vice versa, to interconnect the mating segments 14 and 16. In other words, the arms 18 mechanically connect the mating segment 14 to the mating segment 16. The arms 18 also electrically connect the mating segments 14 and 16 together. As will be described in more detail below, the arms 18 extend along helical paths for at least some distance as the arms 18 extend from the mating segment 14 to the mating segment 16, and vice versa. The mating segment 14 and the mating segment 16 may each be referred to herein as a "mounting segment".

The body 12 of the electrical contact 10 is optionally integrally-formed. For example, the structures 14, 16, and 18 of the body 12 are integrally-formed together in the exemplary embodiment. As used herein, two or more structures are "integrally-formed" when the structures are formed as a single continuous unit. In contrast, two or more structures are not "integrally-formed" if the structures are formed as two or more discrete units. Optionally, two or more structures are "formed as a single continuous unit" whether or not the two or more structures are formed from the same materials and/or are formed simultaneously. In some embodiments, two or more structures are formed as a single continuous unit if the structures are chemically bonded together. Moreover, in some embodiments, two or more structures are formed as a single continuous unit if the structures are incapable of being separated without damaging at least one of the structures. Optionally, two or more structures are "formed as discrete units" whether or not the two structures are formed from the same materials, are formed simultaneously, are engaged with each other, and/or are mechanically connected together. In some embodiments, two or more structures are formed as discrete units if the structures are not chemically bonded to each other. For example, in some embodiments, two or more structures that are engaged with each other and/or are mechanically connected together using a mechanical fastener (e.g., an adhesive that adheres via mechanical means, a clip, a clamp, a threaded fastener, a non-threaded fastener, and/or the like) are optionally considered to be formed as discrete units.

Figure 7:
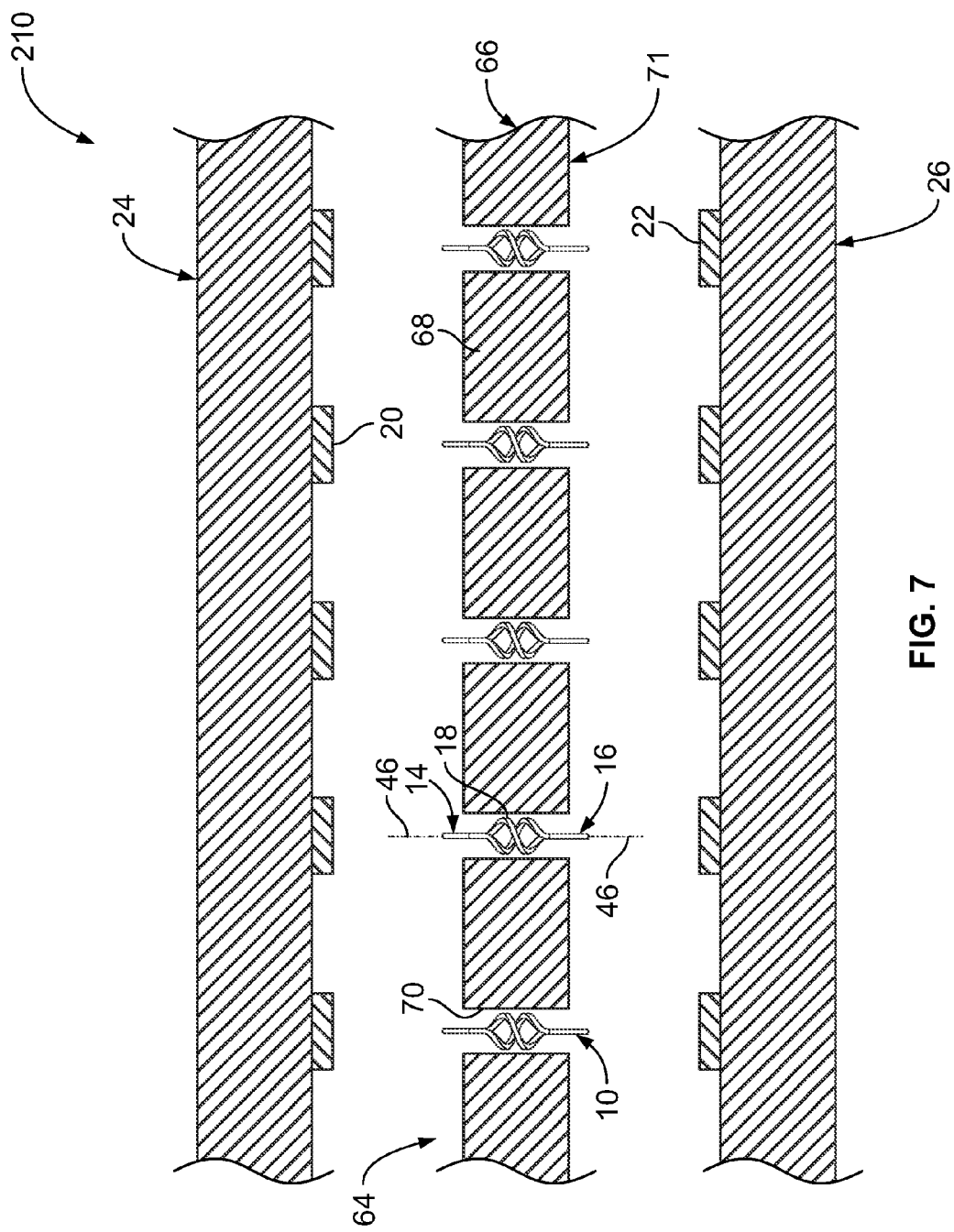

Optionally, the mating segments 14 and 16 each have substantially the same geometry, as in the exemplary embodiment. In other words, the mating segments 14 and 16 each have substantially the same size and shape. But, in alternative embodiments, the mating segments 14 and 16 may have respective different geometries (size and/or shape). The mating segments 14 and 16 are configured to mate with respective mating contacts 20 and 22 (FIG. 7) of respective electrical components 24 and 26 (FIG. 7). The exemplary mating contacts 20 and 22 are contact pads, but may alternatively have any other structure, geometry, and/or the like. Each mating segment 14 and 16 includes a mating surface 28 and 30, respectively, that engages the contact pad that defines the respective mating contact 20 and 22. Optionally, the mating segment 14 and/or the mating segment 16 is soldered to the corresponding contact pad.

The exemplary embodiment of each of the mating segments 14 and 16 includes a paddle-like shape that consists of opposite, approximately planar sides 32 and 34 and an edge 36 that extends from the side 32 to the side 34, and vice versa. The edge 36 of the mating segment 14 includes the mating surface 28, while the edge 36 of the mating segment 16 includes the mating surface 30. Although the mating surfaces 28 and 30 include curves in the exemplary embodiment, the mating surfaces 28 and 30 may each additionally or alternatively include any other shape for engaging a contact pad having any shape, such as, but not limited to, an approximately planar shape and/or the like. Moreover, the mating segments 14 and 16 are not limited to the paddle-like shape, but rather each of the mating segments 14 and 16 may additionally or alternatively include any other shape.

Figure 3:
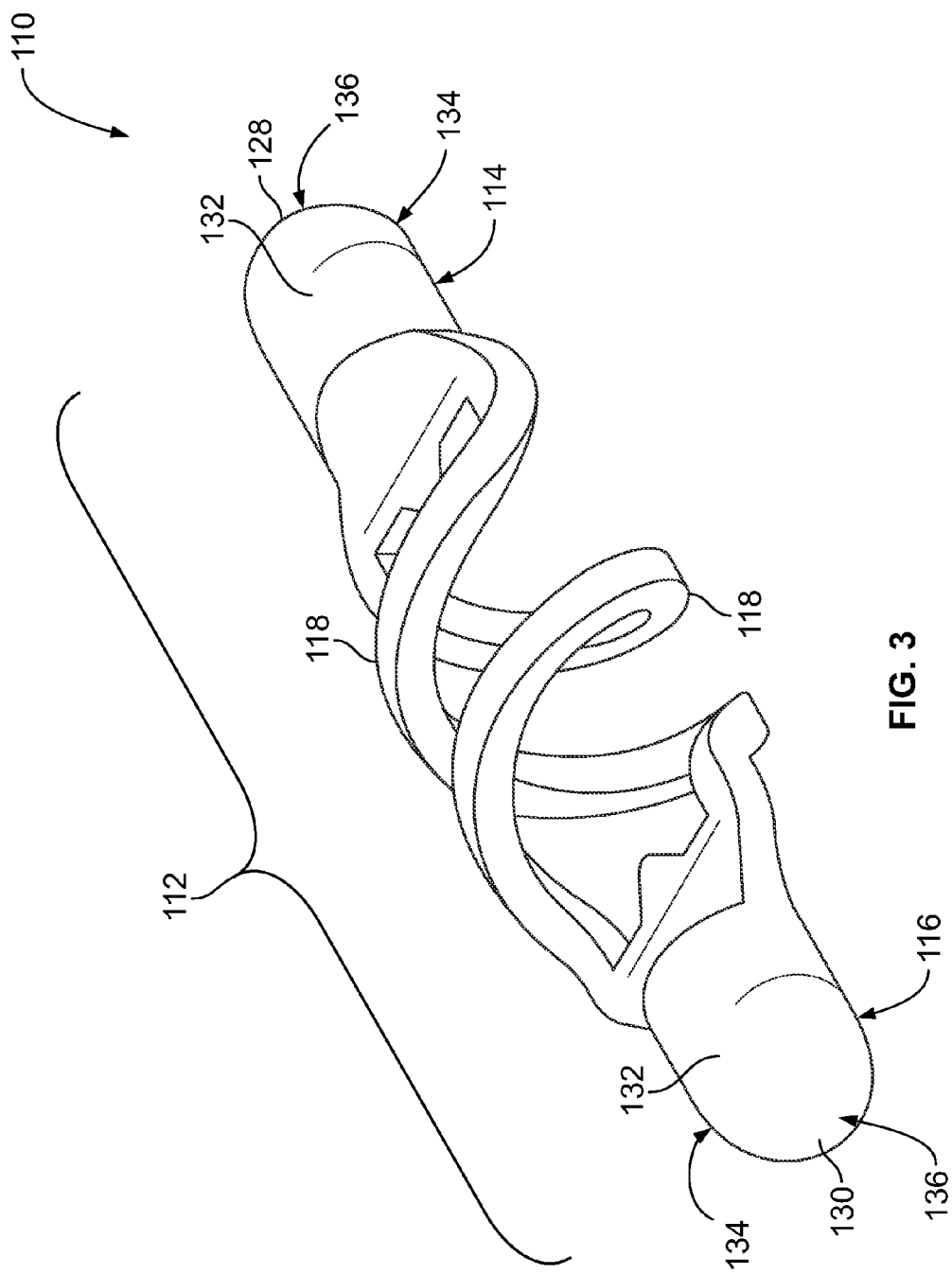
FIG. 3 is a perspective view of an exemplary alternative embodiment of an electrical contact.

For example, FIG. 3 is a perspective view of an exemplary alternative embodiment of an electrical contact 110. The electrical contact 110 includes a body 112 that is optionally integrally-formed. The body 112 includes mating segments 114 and 116 and one or more arms 118 that interconnect the mating segments 114 and 116. The mating segments 114 and 116 illustrate an example of mating segments that include another shape (besides the paddle-like shape of the segments 14 and 16 shown in FIGS. 1, 2, and 4-7). Each of the mating segments 114 and 116 includes a cylindrical wall 132 and an end cap 136 that extends over one of the ends 134 of the wall 132. The cylindrical wall 132 and optionally the end cap 136 include circular cross-sections. The end cap 136 of the mating segment 114 includes a mating surface 128 that is configured to engage the contact pad that defines the corresponding mating contact 20 (FIG. 7) of the electrical component 24 (FIG. 7). The end cap 136 of the mating segment 116 includes a mating surface 130 that is configured to engage the contact pad that defines the corresponding mating contact 22 (FIG. 7) of the electrical component 26 (FIG. 7). Each of the mating surfaces 128 and 130 includes a curve in the exemplary embodiment.

Referring again to FIGS. 1 and 2, other examples of additional or alternative shapes that may be included by each of the mating segments 14 and 16 include, but are not limited to, solder ball pads, solder tails, compliant pins, other pins that are received within an electrical via or other opening within a substrate, and/or the like. An example of a solder ball pad includes bending the mating segments 14 and/or 16 90° and using the side 32 or 34 as a platform for receiving a solder ball thereon. Although the mating segments 14 and 16 each include a respective opposite end 38 and 40 of the body 12 of the electrical contact 10, the mating segment 14 and/or the mating segment 16 alternatively does not include the respective end 38 and 40 of the body 12.

As described above, the arms 18 of the electrical contact body 12 extend along helical paths for at least some distance as the arms 18 extend from the mating segment 14 to the mating segment 16, and vice versa. As used herein, the term "helical path" is intended to mean any path wherein the tangent line at any point makes a constant angle with a fixed line, or axis, in space. The path of each arm 18 extends from an end 42 of the arm 18 that extends from the mating segment 14 to an end 44 of the arm 18 that extends from the mating segment 16, and vice versa. Each arm 18 thereby mechanically connects the mating segment 14 of the body 12 to the mating segment 16 of the body 12, and vice versa. Each arm 18 also provides an electrical path from the mating segment 14 to the mating segment 16, and vice versa, such that the mating segments 14 and 16 are electrically connected together. In the exemplary embodiment, an entirety of the path of each arm 18 from the mating segment 14 to the mating segment 16, and vice versa, is defined by the helical path. But, in some alternative embodiments, only a portion or portions of the path of one or more of the arms 18 from the mating segment 14 to the mating segment 16, and vice versa, is defined by the helical path. In other words, the path of each arm 18 from the mating segment 14 to the mating segment 16, and vice versa, may include one or more non-helical paths in addition to the helical path.

In the exemplary embodiment, each of the arms 18 includes a coil spring that extends a length along a central longitudinal axis 46. The coil spring defined by each arm 18 is configured to resiliently, and at least partially, compress along the central longitudinal axis 46. The coil spring defined by each arm 18 includes one or more winding turns 48 that extend around the central longitudinal axis 46 and define the helical path of the arm 18 from the mating segment 14 to the mating segment 16, and vice versa. The winding turns 48 of each arm 18 may be separated by any pitch (whether or not the pitch between winding turns 48 of an arm 18 is the same as the pitch between winding turns 48 of any other arms 18). Each arm 18 may include any number of winding turns 48. Moreover, the coil spring of each arm 18 may be right-handed or left-handed, whether or not the same as the coil spring of any other arms 18. A central opening 50 extends within the helical path of each of the arms 18. In the exemplary embodiment, the helical path of each of the arms 18 defines a circular, or cylindrical, helix. Alternatively, the helical path of one or more of the arms 18 defines a conic helix (tapering toward either end 42 or 44).

Two arms 18 are provided in the exemplary embodiment. But, the body 12 of the electrical contact 10 may include any number of arms 18 that extend from the mating segment 14 to the mating segment 16, and vice versa. The arms 18 are disengaged from each other. Although both of the arms 18 are shown herein as including coil springs, any of the arms 18 may additionally or alternatively include another type of spring, such as, but not limited to, a leaf spring and/or the like. The arms 18 are optionally arranged relative to each other such that the helical paths of the arms 18 define a double helix, as in the exemplary embodiment. More specifically, the helical paths of the arms 18 share the same central longitudinal axis 46 and differ by a translation along the axis 46. The helical paths of the arms 18 may differ by any amount of translation, such as but not limited to, approximately half the pitch between the winding turns 48 of either or both of the arms 18.

In an alternative embodiment, the arms 18 do not share the central longitudinal axis 46, but rather the central longitudinal axes of the arms 18 are different axes (e.g., spaced apart, or offset, from each other). In the exemplary embodiment, the shared central longitudinal axis 46 of the arms 18 also defines a central longitudinal axis 46 of the electrical contact body 12. But, the central longitudinal axis of the electrical contact body 12 may alternatively be spaced from the central longitudinal axis of one, both (and/or all) of the arms 18, whether or not any of the arms 18 share a central longitudinal axis. Moreover, alternatively the arms 18 do not share the central opening 50, but rather the central openings of the arms 18 are different openings (e.g., spaced apart, or offset, from each other). The shared central opening 50 of the arms 18 also defines a central opening 50 of the electrical contact body 12 in the exemplary embodiment. But, a central opening of the electrical contact body 12 may alternatively be spaced from the central opening of one, both (and/or all) of the arms 18, whether or not any of the arms 18 share a central opening.

Figure 4:
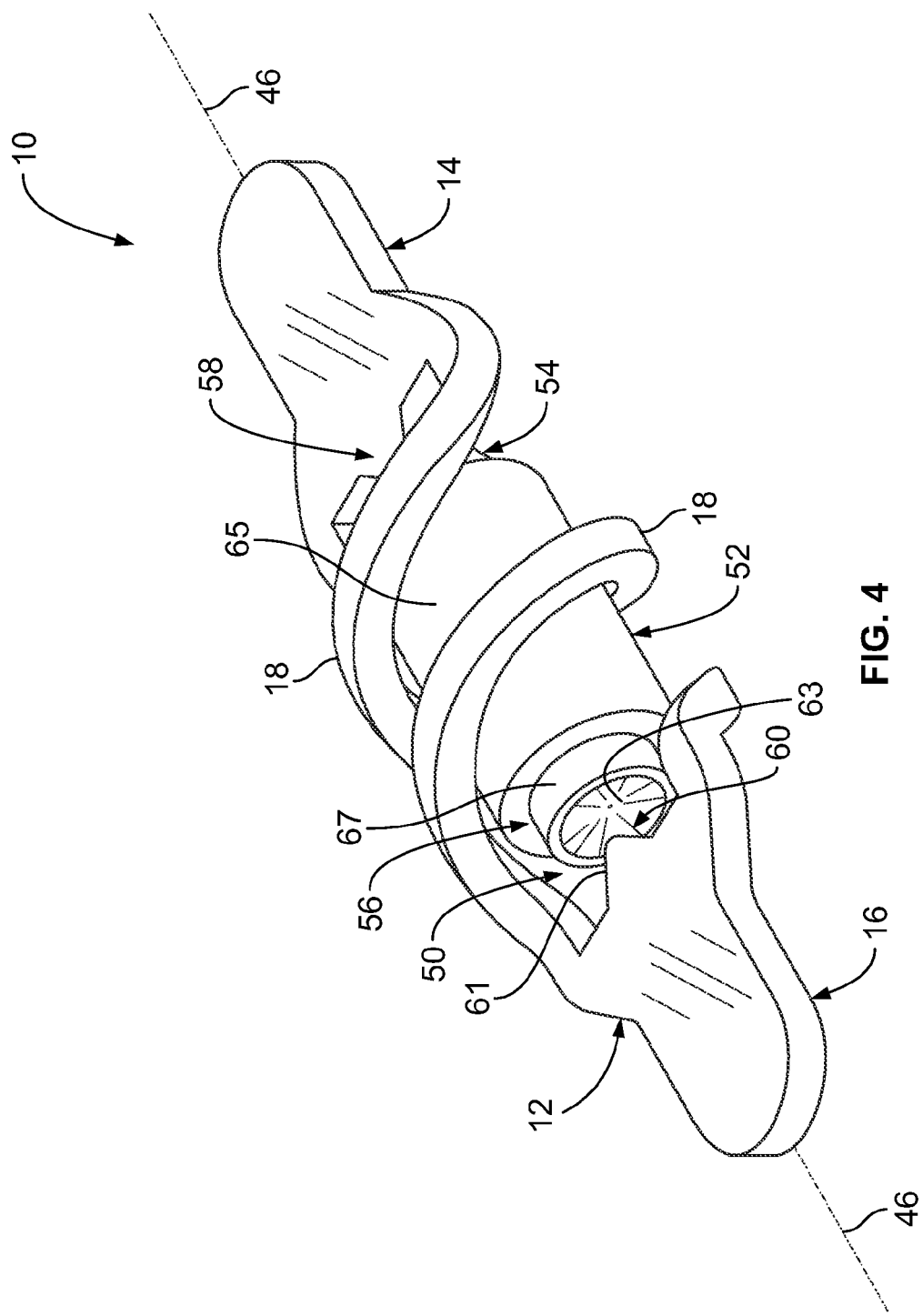
FIG. 4 is a perspective view of the electrical contact shown in FIGS. 1 and 2 in combination with an exemplary embodiment of an arbor.
Figure 5:
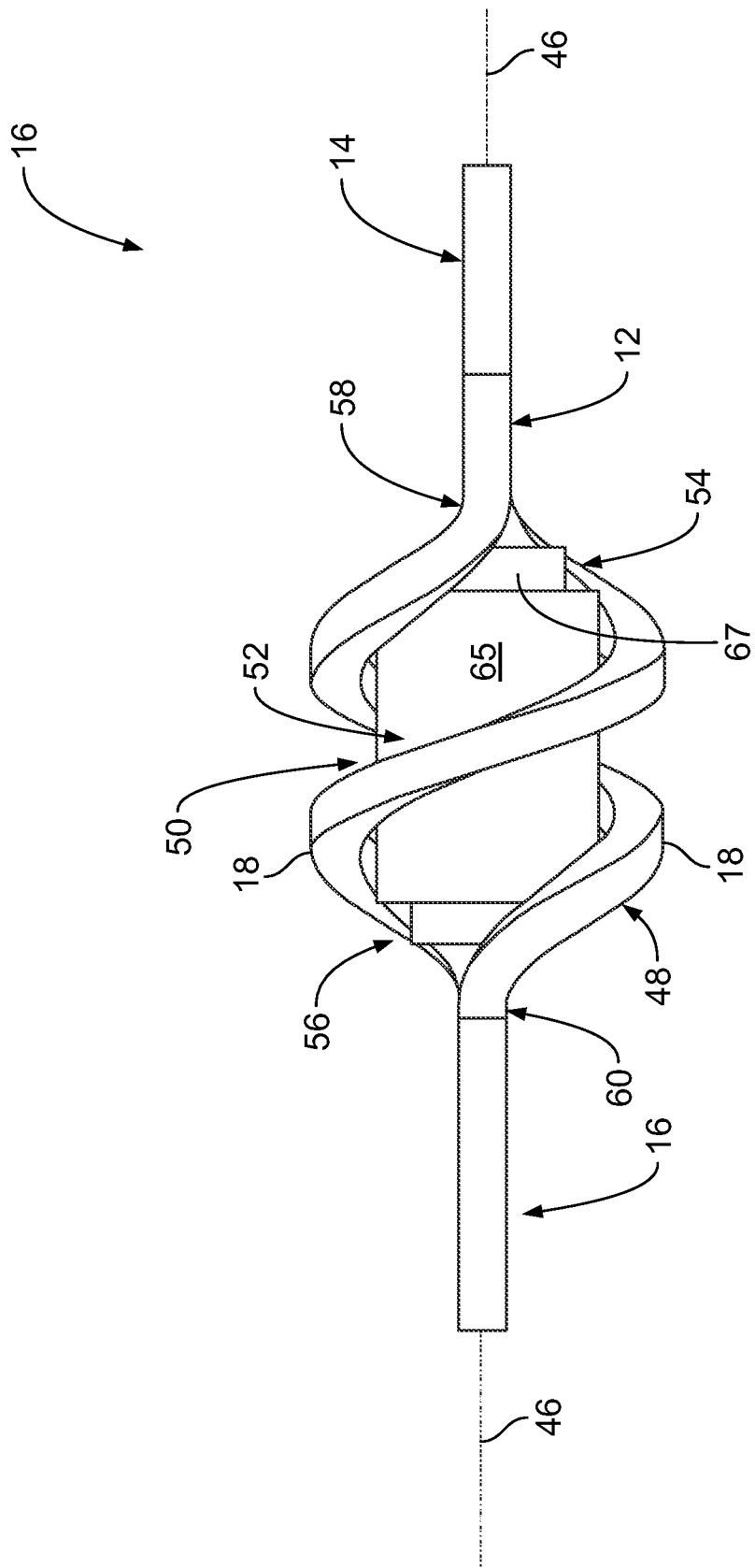
FIG. 5 is a side elevational view of the electrical contact and arbor shown in FIG. 4.

Optionally, an arbor is received within the central opening 50 of the electrical contact body 12. The arbor may be used to support the body 12 during fabrication of the electrical contact 10, to support and/or assist the spring operation of the arms 18, and/or to provide an electrical path from the mating segment 14 to the mating segment 16, and vice versa. For example, FIG. 4 is a perspective view of the electrical contact 10 illustrating an arbor 52 received within the central opening 50 of the electrical contact body 12. FIG. 5 is a side elevational view of the electrical contact 10 with the arbor 52 received within the central opening 50. Referring now to FIGS. 4 and 5, the arbor 52 extends from a mating end 54 to a mating end 56. When the arms 18 of the electrical contact body 12 are at least partially compressed along the central longitudinal axis 46, the mating end 54 engages an end 58 of the mating segment 14 in electrical connection therewith and the mating end 56 engages an end 60 of the mating segment 16 in electrical connection therewith. Optionally, the ends 58 and 60 include engagement tips 61 (not visible in FIG. 5) that are received within corresponding optional seats 63 (not visible in FIG. 5) of the mating ends 54 and 56 of the arbor 52.

The arbor 52 is optionally electrically conductive. Accordingly, the arbor 52 provides an electrical path from the mating segment 14 to the mating segment 16, and vice versa, when the mating ends 54 and 56 are engaged with the mating segments 14 and 16, respectively. The electrical path provided by the arbor 52 may provide a more direct electrical path between the mating segments 14 and 16 than the electrical paths provided by the arms 18.

In the exemplary embodiment, the arbor 52 includes an elastomeric column 65 that is formed from an elastomeric material. In some embodiments, the elastomeric material is electrically conductive and/or the elastomeric column 65 includes an electrically conductive component, such as, but not limited to, an electrical trace, an electrical contact, and/or the like. In some embodiments, the elastomeric material of the elastomeric column 65 is non-electrically conductive (whether or not the elastomeric column 65 includes an electrically conductive component). In the exemplary embodiment, the arbor 52 is electrically conductive and the electrical conductivity of the arbor 52 is provided by a metal rod 67, but the electrical conductivity of the arbor may additionally or alternatively be provided by flakes or other particles embedded within the elastomeric material of the elastomeric column 65, one or more contacts and/or traces embedded within the column 65 and/or extending on an exterior surface of the column 65, and/or the like. In some alternative embodiments, the arbor 52 does not include the elastomeric material. For example, in some alternative embodiments, the arbor 52 is fabricated from a metal rod and/or other shaped metal structure and does not include the elastomeric column 65. Moreover, in some alternative embodiments the arbor 52 is fabricated entirely from one or more electrically insulative materials, which may be generally rigid, generally non-rigid, elastomeric, and/or the like. The mating ends 54 and 56 of the arbor 52 may each be referred to herein as a "mounting end".

As described above, the arbor 52 is optionally fabricated from an elastomeric material. In the exemplary embodiment, the elastomeric material provides the arbor 52 with a spring functionality. More specifically, the arbor 52 is resiliently, and at least partially, compressible within the central opening 50 and along the central longitudinal axis 46. The spring functionality of the arbor 52 supports and/or assists the spring operation of the arms 18, which is described below. For example, the spring functionality of the arbor 52 may increase the resistance of the arms 18 to compressing along the central longitudinal axis 46, may increase the return force of the arms 18, and/or may act as a damper with regard to compressing and returning of the arms 18 along the central longitudinal axis 46. Optionally, the arbor 52 is provided with a spring functionality but is not electrically conductive.

Figure 6:
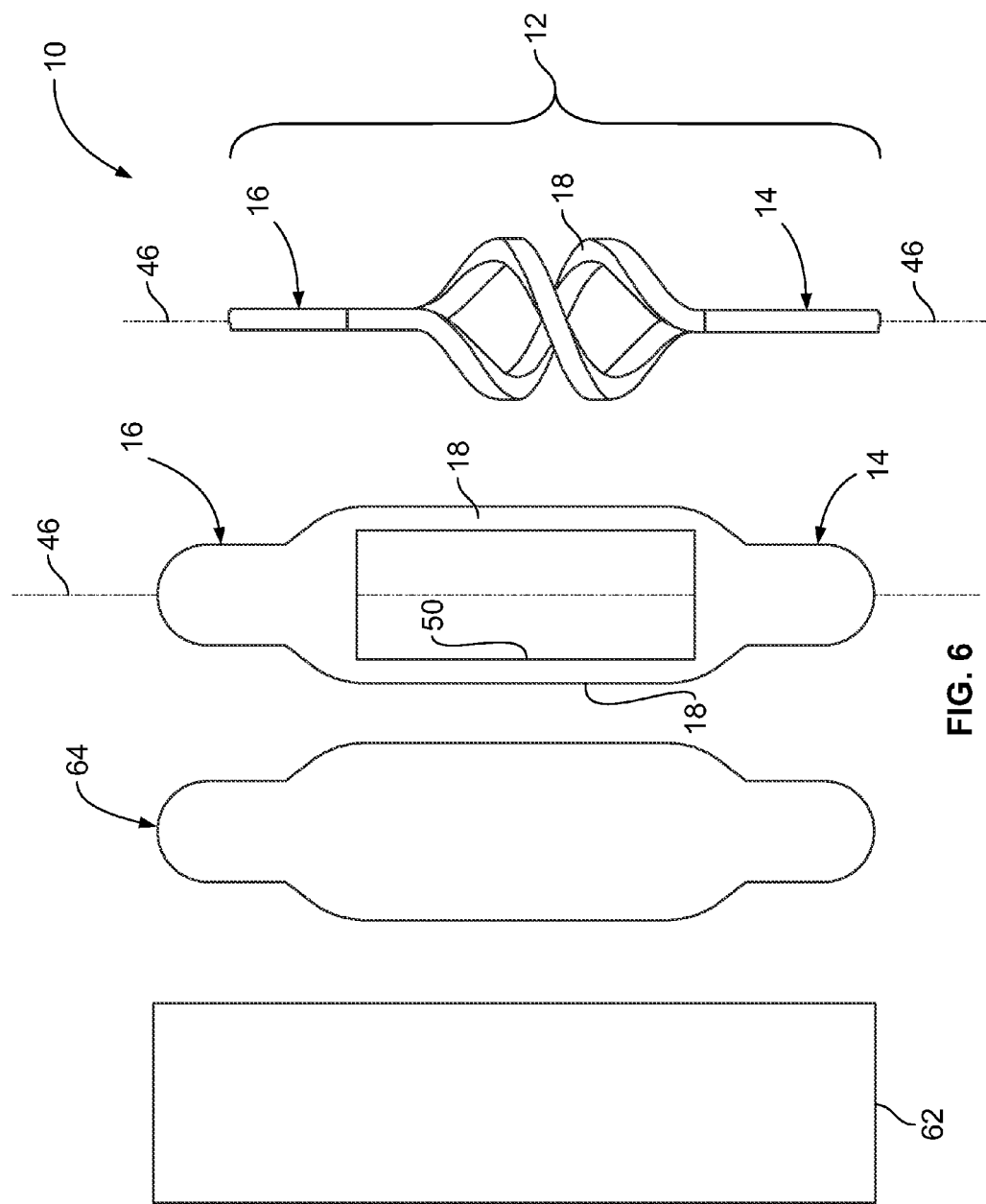
FIG. 6 is a top plan view illustrating a method for fabricating the electrical contact shown in FIGS. 1 and 2.

FIG. 6 is a top plan view illustrating a method for fabricating the electrical contact 10. In the exemplary embodiment, the electrical contact 10 is fabricated from a sheet of material 62. Alternatively, the electrical contact 10 is fabricated from a cylindrical material (such as, but not limited to, a cylindrical rod, a wire, and/or the like). For example, the electrical contact 110 shown in FIG. 3 is fabricated from a cylindrical material. Referring now to FIG. 6, the sheet of material 62 is first cut into a blank 64 having the general outline of the body 12 of the electrical contact 10. Next, the central opening 50 is cut into the blank 64 to define the arms 18. The mating segments 14 and 16 are then twisted about the central longitudinal axis 46 in opposite directions relative to each other to twist the arms 18 into the helical paths. The mating segment 14 is thereby rotated on the central longitudinal axis 46 with respect to the mating segment 16, and vice versa.

The blank 64 and the central opening 50 may be cut using any suitable method, structure, means, process, and/or the like, such as, but not limited to, machining, laser cutting, chemical etching, cutting with a sharp or pointed objection, cutting with a hand tool, water cutting, stamping, and/or the like. As described above, an arbor (not shown) may be used to support the body 12 during fabrication of the electrical contact 10. Specifically, the arbor may be inserted into the central opening 50 before the mating segments 14 and 16 are twisted to form the helical paths of the arms 18. During twisting of the mating segments 14 and 16, the arbor supports the body 12 to facilitate preventing the arms 18 from breaking. The arbor is optionally removed after the body 12 of the electrical contact 10 has been fabricated.

FIG. 7 is an exploded cross-sectional view of an exemplary embodiment of an electrical component assembly 210 with which the electrical contacts described and/or illustrated herein (e.g., the electrical contacts 10, 110, 210, 310, and/or 410) may be used. For simplicity, the electrical component assembly 210 will be described and illustrated herein with the electrical contacts 10. The electrical contacts described and/or illustrated herein are not limited to being used with the electrical components assembly 210, but rather may be used with any other type of electronic system. The assembly 210 includes a pair of electrical components 24 and 26 and an interconnect member 66 for electrically connecting the electrical components 24 and 26 together. The electrical components 24 and 26 each include an array of a plurality of the mating contacts 20 and 22, respectively. The array of the mating contacts 20 of the electrical component 24 substantially matches the pattern of the array of the mating contacts 22 of the electrical component 26. The interconnect member 66 includes an array of the electrical contacts 10 for electrically connecting the electrical components 24 and 26 together. The array of the electrical contacts 10 of the interconnect member 66 substantially matches the pattern of the arrays of mating contacts 20 and 22 of the electrical components 24 and 26, respectively.

The interconnect member 66 includes a carrier 68 having a side 69, and opposite side 71, and an array of a plurality of openings 70. The electrical contacts 10 are disposed in the openings 70. The mating segment 14 of each electrical contact 10 is exposed along the side 69 of the carrier 68 for engagement with the corresponding mating contact 20 of the electrical component 24. Similarly, the mating segment 16 of each electrical contact 10 is exposed along the side 71 of the carrier 68 for engagement with the corresponding mating contact 22 of the electrical component 26. When the interconnect member 66 is sandwiched between the electrical components 24 and 26, the mating segments 14 and 16 of the electrical contacts 10 engage the respective mating contacts 20 and 22 of the electrical components 24 and 26, respectively, to electrically connect the electrical components 24 and 26 together. As the interconnect member 66 is initially mated between the electrical components 24 and 26, the arms 18 of the electrical contacts 10 at least partially compress along the central longitudinal axis 46. The spring operation (e.g., the resilience) of the arms 18 causes the arms 18 to provide a biasing force that biases the mating segments 14 and 16 toward the respective mating contacts 20 and 22. The biasing force may facilitate providing a reliable electrical connection between the mating segments 14 and 16 and the mating contacts 20 and 22, respectively. The mating side 69 and the mating side 71 may each be referred to herein as a "mating side" and/or a "mounting side".

The electrical components 24 and 26 may each be any suitable type of electrical component, such as, but not limited to, a printed circuit board, an integrated circuit, an electrical module, a chip, a package, a processor, a microprocessor, a central processing unit (CPU), a memory, an integrated circuit, an application specific integrated circuit (ASIC), other electrical devices, and/or the like. The arrays of the mating contacts 20 and 22 may each be any suitable type of array of electrical contacts that enables operative electrical connection between the electrical components 24 and 26, such as, but not limited to, Pin Grid Arrays (PGAs), Land Grid Arrays (LGAs), and/or Ball Grid Arrays (BGAs). Moreover, the arrays of the mating contacts 20 and 22 may have any suitable configuration, arrangement, and/or pattern of electrical contacts that enables operative electrical connection between the electrical components 24 and 26.

FIG. 8 is a side elevational view of another exemplary alternative embodiment of an electrical contact 210. The electrical contact 210 includes a body 212 that is integrally-formed. FIG. 8 illustrates an embodiment of an electrical contact 210 that is fabricated from an electrically conductive wire 213. The body 212 includes mating segments 214 and 216 and arms 218 that interconnect the mating segments 214 and 216. The arms 218 extend along helical paths for at least some distance as the arms 218 extend from the mating segment 214 to the mating segment 216, and vice versa. The mating segments 214 and 216 include respective mating surfaces 228 and 230 that are configured to engage the contact pads that define the mating contacts 20 and 22 (FIG. 7), respectively, of the respective electrical component 24 and 26 (FIG. 7). The mating segment 214 and the mating segment 216 may each be referred to herein as a "mounting segment".

In the exemplary embodiment, each of the arms 218 includes a coil spring having one or more winding turns 248 that define the helical path of the arm 218. As described above, the electrical contact 210 is fabricated from an electrically conductive wire 213. The wire 213 may include any electrically conductive materials and may include any number of strands of material. In some embodiments, the wire 213 includes only a single strand of material. The electrical wire 213 is bent to form a loop having the mating segments 214 and 216. The mating segments 214 and 216 are then twisted in opposite directions relative to each other to twist the arms 218 into the helical paths.

Each arm 218 may include any number of winding turns 248. FIG. 9 is a side elevational view of another exemplary alternative embodiment of an electrical contact 310 illustrating a greater number of winding turns 348. Specifically, the electrical contact 310 includes an integrally-formed body 312 that is fabricated from an electrically conductive wire 313. The body 312 includes mating segments 314 and 316 and arms 318 that interconnect the mating segments 314 and 316. The mating segment 314 and the mating segment 316 may each be referred to herein as a "mounting segment". The arms 318 extend along helical paths for at least some distance as the arms 318 extend from the mating segment 314 to the mounting segment 316, and vice versa. The helical paths are each defined by one or more winding turns 348. As can be seen from a comparison of FIGS. 8 and 9, each of the arms 318 of the electrical contact 310 include a greater number of winding turns 348 than the number of winding turns 248 of the arms 218 of the electrical contact 210.

Figure 10:
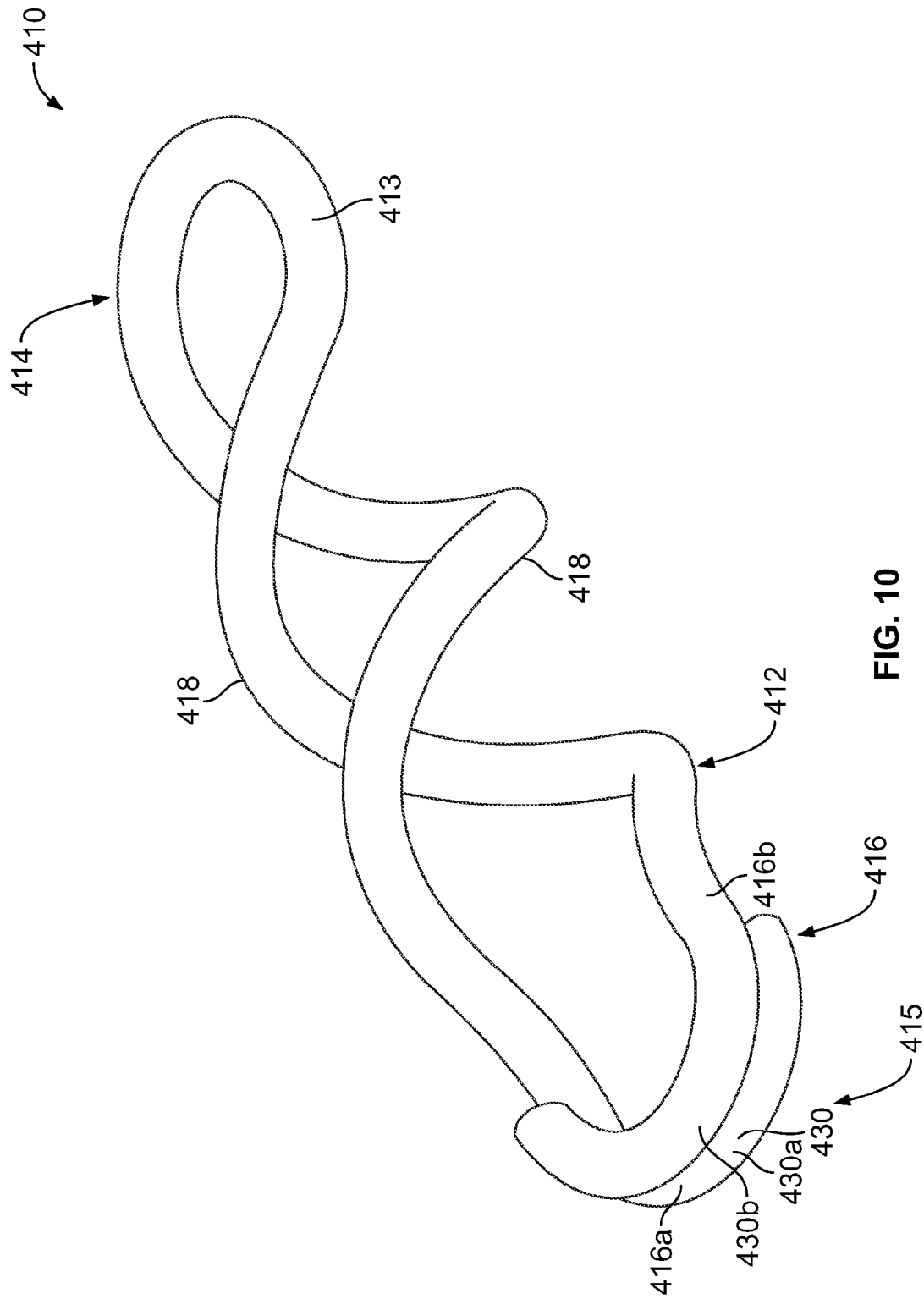
FIG. 10 is a perspective view of yet another exemplary alternative embodiment of an electrical contact.

Referring again solely to FIG. 8, in the exemplary embodiment, the mating segment 216 is defined by two legs 216a and 216b that each include a respective portion 230a and 230b of the mating surface 230. The legs 216a and 216b are defined by opposite ends of the wire 213 and define an open end 215 of the body 212 of the electrical contact 210. Alternatively, the mating segment 216 defines a closed end of the contact body 212. For example, FIG. 10 is a perspective view of another exemplary alternative embodiment of an electrical contact 410 illustrating a closed end 415 at a mating segment 416. The electrical contact 410 includes an integrally-formed body 412 that is fabricated from an electrically conductive wire 413. The body 412 includes mating segments 414 and 416 and arms 418 that interconnect the mating segments 414 and 416. The mating segment 414 and the mating segment 416 may each be referred to herein as a "mounting segment".

The mating segment 416 is defined by two legs 416a and 416b. The legs 416a and 416b are defined by opposite ends of the wire 413. As can be seen in FIG. 10, the legs 416a and 416b have been bent and overlapped such that the legs 416a and 416b define a closed end 415 of the body 412 of the electrical contact 410. Each of the legs 416a and 416b includes a portion 430a and 430b, respectively, of a mating surface 430 that is configured to engage the contact pad that defines the corresponding mating contact 22 (FIG. 7) of the electrical component 26 (FIG. 7).

Figure 11:
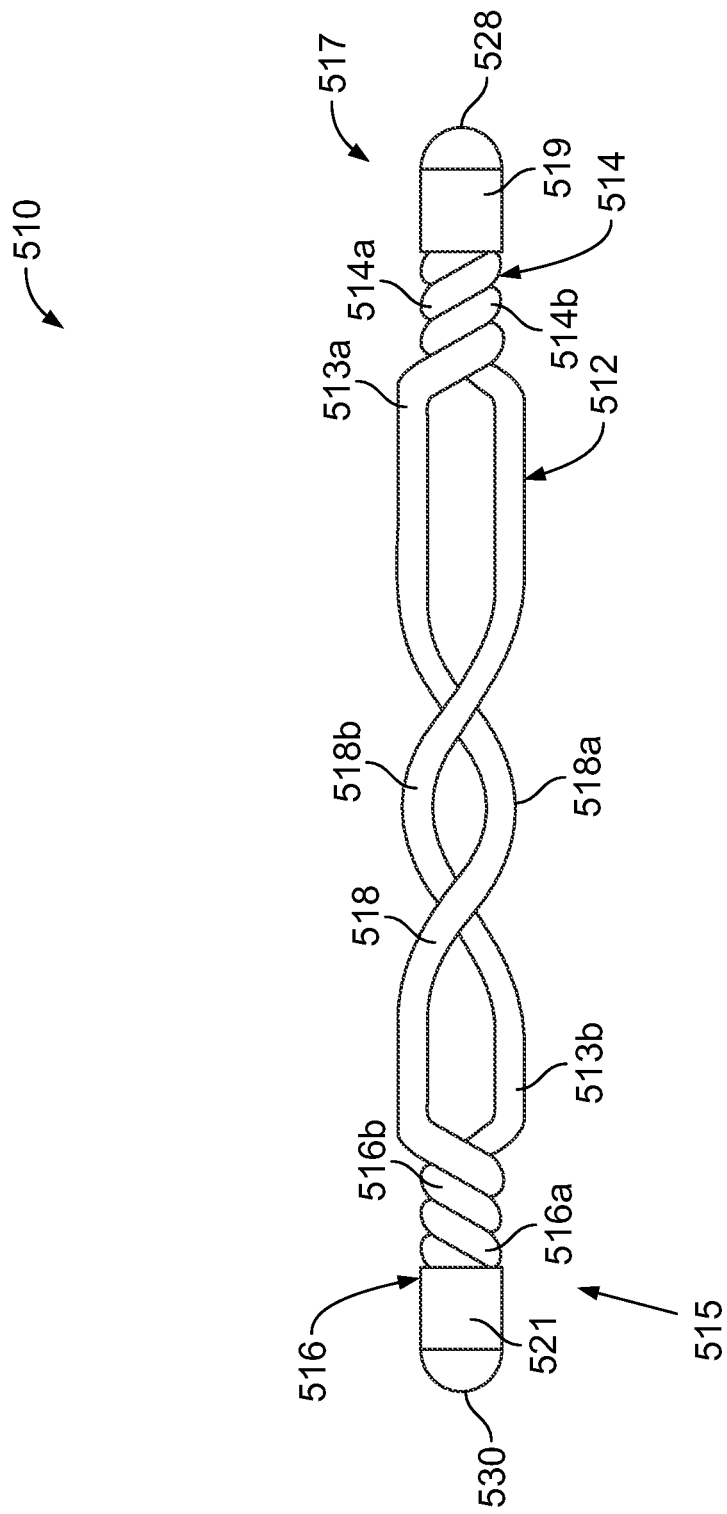
FIG. 11 is a side elevational view of still another exemplary alternative embodiment of an electrical contact.

The legs 416a and 416b are not limited to being bent and overlapped in the manner shown in FIG. 10 to form the closed end 415 of the electrical contact body 412. For example, FIG. 11 is a perspective view of another exemplary alternative embodiment of an electrical contact 510 illustrating a closed end 515 that is formed by twisting two legs 516a and 516b around each other. FIG. 11 also illustrates an embodiment wherein a body 512 of the electrical contact 510 is fabricated from two electrically conductive wires 513a and 513b. The body 512 includes mating segments 514 and 516 and arms 518 that interconnect the mating segments 514 and 516. The mating segment 514 and the mating segment 516 may each be referred to herein as a "mounting segment".

Each wire 513a and 513b defines a corresponding one of the arms 518. Specifically, a segment of the wire 513a forms an arm 518a and a segment of the wire 513b forms an arm 518b. The mating segment 516 is defined by a leg 516a of the wire 513a and a leg 516b of the wire 513b. The legs 516a and 516b have been twisted around each other such that the legs 516a and 516b define the closed end 515 of the body 512. In the exemplary embodiment, the mating segment 514 is also defined by legs 514a and 514b of the wires 513a and wire 513b, respectively, that are twisted together to form a closed end 517 of the electrical contact body 512.

Optionally, the mating segments 514 and/or 516 include an electrically conductive cap 519 and/or 521, respectively, that is received over at least a portion of the respective closed end 515 and/or 517. The caps 519 and 521 include respective mating surfaces 530 and 528 that are configured to engage the contact pad that defines the corresponding mating contact 22 and 24 (FIG. 7), respectively, of the electrical component 26 (FIG. 7).

Although shown and described as being fabricated from two wires 513a and 513b, the body 512 of the electrical contact 510 may be fabricated from any number of wires 513. Moreover, the body 512 is not limited to both ends 515 and 517 being closed, nor is the body 512 limited to both mating segments 514 and 516 being formed from legs that are twisted together as shown in FIG. 11. Rather, in some alternative embodiments, the end 515 and/or the end 517 is open. Moreover, in some alternative embodiments, the mating segment 514 and/or the mating segment 516 is formed from two legs that are not twisted together, is formed from two legs that are bent and overlapped as shown in FIG. 10, and/or the like.

The embodiments described and/or illustrated herein may provide an electrical contact for an interconnect member wherein the electrical contact has an increased working range as compared to at least some known electrical contacts of interconnect members. The embodiments described and/or illustrated herein may provide an electrical contact for an interconnect member wherein a contact force required to compress the contact is reduced as compared to at least some known electrical contacts of interconnect members. The embodiments described and/or illustrated herein may provide an electrical contact for an interconnect member wherein the contact includes an increased working range and a reduced contact force as compared to at least some known electrical contacts of interconnect members.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the subject matter described and/or illustrated herein should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. An electrical contact comprising:
an integrally-formed body comprising:
a mating segment;
a mounting segment; and
a pair of arms interconnecting the mating segment and the mounting segment, wherein the arms extend along helical paths for at least some distance as the arms extend from the mating segment to the mounting segment.

2. The electrical contact according to claim 1, wherein the body extends a length along a central longitudinal axis, the arms comprising coil springs that are configured to at least partially compress along the central longitudinal axis.

3. The electrical contact according to claim 1, wherein the arms are arranged relative to each other such that the helical paths of the arms define a double helix.

4. The electrical contact according to claim 1, wherein the body comprises a central opening extending within the helical paths of the arms, the electrical contact further comprising an arbor received within the central opening.

5. The electrical contact according to claim 1, wherein the body comprises a central opening extending within the helical paths of the arms, the electrical contact further comprising an arbor received within the central opening, the arbor being electrically conductive, the arbor comprising a mating end engaged in electrical connection with the mating segment of the body and a mounting end engaged in electrical connection with the mounting segment of the body.

6. The electrical contact according to claim 1, wherein the body comprises a central opening extending within the helical paths of the arms, the electrical contact further comprising an arbor received within the central opening, the arbor comprising at least one of an elastomeric material or a non-conductive material.

7. The electrical contact according to claim 1, wherein the arms are disengaged from each other.

8. The electrical contact according to claim 1, wherein the body is fabricated from one of a sheet of material or a cylindrical material, the body extends along a central longitudinal axis, and the mating segment is rotated on the central longitudinal axis with respect to the mounting segment.

9. The electrical contact according to claim 1, wherein the body is fabricated from a wire.

10. The electrical contact according to claim 1, wherein the mating and mounting segments comprise circular cross-sections.

11. An interconnect member for electrically connecting a pair of electrical components, said interconnect member comprising:
   a carrier having opposite mating and mounting sides, the carrier comprising an opening extending through the carrier; and
   an electrical contact disposed in the opening of the carrier, the electrical contact comprising an integrally-formed body comprising a mating segment, a mounting segment, and a pair of arms interconnecting the mating segment and the mounting segment, the electrical contact being arranged in the opening of the carrier such that the mating segment is exposed along the mating side of the carrier and such that the mounting segment extends along the mounting side of the carrier, wherein the arms extend along helical paths for at least some distance as the arms extend from the mating segment to the mounting segment.

12. The interconnect member according to claim 11, wherein the body of the electrical contact extends a length along a central longitudinal axis, the arms comprising coil springs that are configured to at least partially compress along the central longitudinal axis.

13. The interconnect member according to claim 11, wherein the arms of the body of the electrical contact are arranged relative to each other such that the helical paths of the arms define a double helix.

14. The interconnect member according to claim 11, wherein the body of the electrical contact comprises a central opening extending within the helical paths of the arms, the electrical contact further comprising an arbor received within the central opening, the arbor comprising a mating end engaged in electrical connection with the mating segment of the body and a mounting end engaged in electrical connection with the mounting segment of the body.

15. The interconnect member according to claim 11, wherein the body of the electrical contact comprises a central opening extending within the helical paths of the arms, the electrical contact further comprising an arbor received within the central opening, the arbor comprising an elastomeric material.

16. The interconnect member according to claim 11, wherein the arms of the body of the electrical contact are disengaged from each other.

17. The interconnect member according to claim 11, wherein the body of the electrical contact is fabricated from one of a sheet of material or a cylindrical material, the body extends along a central longitudinal axis, and the mating segment is rotated on the central longitudinal axis with respect to the mounting segment.

18. The interconnect member according to claim 11, wherein the body of the electrical contact is fabricated from a wire.

19. The interconnect member according to claim 11, wherein the mating and mounting segments of the body of the electrical contact comprise circular cross-sections.

* * * * *